US006759927B2

(12) United States Patent
Maguire et al.

(10) Patent No.: US 6,759,927 B2
(45) Date of Patent: Jul. 6, 2004

(54) ISOLATION SHIELD ASSEMBLY FOR ELECTRICAL FILTERS AND A METHOD OF MANUFACTURING ELECTRICAL FILTERS INCLUDING SAME

(75) Inventors: Joseph N. Maguire, Syracuse, NY (US); Joseph A. Zennamo, Jr., Skaneateles, NY (US); Gary Clark, Constantia, NY (US); Michael Lamb, Minoa, NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

(21) Appl. No.: 10/301,014

(22) Filed: Nov. 21, 2002

(65) Prior Publication Data

US 2003/0098760 A1 May 29, 2003

Related U.S. Application Data

(60) Provisional application No. 60/333,397, filed on Nov. 27, 2001, and provisional application No. 60/415,470, filed on Oct. 2, 2002.

(51) Int. Cl.[7] .................................................. H03H 7/01
(52) U.S. Cl. ........................................ 333/185; 333/175
(58) Field of Search .......................... 333/12, 167, 185, 333/175

(56) References Cited

U.S. PATENT DOCUMENTS 4,451,803 A 5/1984 Holdsworth et al. .......... 333/12
5,150,087 A 9/1992 Yoshie et al. ............... 333/185
6,429,754 B1 * 8/2002 Zennamo et al. ........... 333/167

* cited by examiner

*Primary Examiner*—Robert Pascal
*Assistant Examiner*—Dean Takaoka
(74) *Attorney, Agent, or Firm*—Burr & Brown

(57) ABSTRACT

An electronic signal filter is provided, including a cylindrical housing and a single circuit board having a first filter section and a second filter section being positioned within the interior compartment of the cylindrical housing such that it effectively divides the interior compartment of the cylindrical housing into a first compartment and a second compartment. A first shield member is also provided, extending from the first surface of the circuit board, and a second shield member radially opposing the first shield member and extending from the second surface of the single circuit board is also provided. The second shield member is a discrete component from, and electrically connected to, the first shield member.

38 Claims, 9 Drawing Sheets

ISOLATION SHIELD ASSEMBLY FOR ELECTRICAL FILTERS AND A METHOD OF MANUFACTURING ELECTRICAL FILTERS INCLUDING SAME

CROSS REFERENCE TO RELATED APPLICATIONS

This application claims the benefit of U.S. Provisional Application Serial No. 60/333,397 filed Nov. 27, 2001 and U.S. Provisional Application Serial No. 60/415,470 filed Oct. 2, 2002, the entireties of which are incorporated herein by reference.

BACKGROUND OF THE INVENTION

Various types of electrical signal filters are used in the CATV industry for controlling, on a frequency basis, the propagation of signals through a cable line. One example of such a filter is known as a notch filter. It is important that such notch filters offer a high level of attenuation, as well as precise and easy tuning capabilities, while maintaining a small size and economical construction.

A high level of attenuation can be realized by using a plurality of interconnected filter circuits on one or more circuit boards within the notch filter assembly. However, in this situation, it is critical that the multiple filter circuits (i.e., filter sections) be magnetically isolated from one another to avoid interference, such as cross-talk or magnetic coupling, between the filter circuits within the filter housing.

Using isolation shields to prevent unwanted cross-talk between filter circuits within a filter is known. One example of a filter having multiple filter circuits and including isolation shielding is disclosed in U.S. Pat. No. 4,451,803, the entirety of which is incorporated herein by reference. The '803 patent discloses a split tuning notch filter for removing a selected frequency or band of frequencies from a CATV signal. With reference to FIG. 8, a split tuning filter includes a common circuit board 100 having first 102 and second 103 filter sections formed thereon by discrete electronic components such as inductors, capacitors and the like (not shown).

Isolation shields 104, 105 are arranged at a midpoint along circuit board 100 to provide magnetic isolation between first filter section 102 and second filter section 103. Each shield includes a radially extending disc section 106 and a longitudinally extending flange section 107. A slot 108 is formed in each shield, to allow the remaining, unslotted portion of disc 106 to slide into a corresponding slot 101 formed in circuit board 100.

One of the shields is positioned in a slot formed on one side of the circuit board, and the other shield is positioned in a slot formed on an opposed side of the circuit board, as shown in FIG. 8. As explained in the '803 patent, this type of arrangement prevents any "line of sight" communication between components in the first and second filter sections. Once the shields 104, 105 are positioned on opposite sides of circuit board 100 and soldered in place. The circuit board is inserted into housing 109, and the shields are then soldered into the housing 109. The open end of the housing 109 is then closed by assembling the filter cap 110. This subassembly is then often inserted into a tube sleeve housing (not shown) to form the final filter structure.

Another example of a filter having multiple isolated filter sections is disclosed in U.S. Pat. No. 5,150,087. Like the '803 patent, the '087 patent uses a pair of manually laterally inserted, axially opposed isolation shields to separate multiple filter sections. However, unlike the single circuit board used in the '803 patent, the '087 patent uses a plurality of isolated independent circuit boards interconnected by a wire through the pair of shields. Nonetheless, in order to achieve the proper isolation and grounding, two shields are required to prevent line of sight between the two circuit boards. But even a single circuit board having multiple filter circuits (e.g., '803 patent) typically requires at least two axially opposed isolation shields to accommodate a conductor or conductive trace (interconnecting multiple filter sections) while otherwise magnetically isolating the filter sections and preventing a line of sight therebetween. If the conductive trace is printed on the circuit board, it is also necessary for the slot 108 in each shield to include a clearance to prevent contact with the conductive trace.

While filters, such as the ones disclosed in the '803 and '087 patents, can successfully provide magnetic isolation between the first and second filter sections, there are several drawbacks associated with the use of such shield pairings. For example, although the discrete electrical components can be assembled on a circuit board using automated Z-axis manufacturing techniques and then wave soldered onto the circuit board en mass in a single economical and efficient manufacturing step, subsequent assembly steps, i.e., shield assembly and soldering steps, require substantial, precise manual labor.

More specifically, the shields must be manually attached to the circuit board by laterally positioning and fixturing the two shields into the corresponding slots in the circuit board. The shields must then be soldered to the circuit board before insertion into the housing. After insertion into the filter housing, the shields must again be soldered to the filter housing in order to properly ground the shields and the circuit board. The amount of manual assembly and soldering required in such a manufacturing process drives up the production cost and, in turn, increases the final cost to customers.

Thus, an electronic filter assembly, including a single circuit board separated into distinct and isolated filter sections using isolation shields, that can be economically produced using an automated manufacturing process, involving few, if any, manual assembly steps is desired. An electronic signal filter having a single circuit board including multiple filter circuits separated by isolation shields that can be automatically assembled onto the circuit board using Z-axis robotics-type automated assembly is also desired. Further, a substantially automated method of manufacturing such filters is desired, and it is especially desired that the automation steps be efficiently performed in a Z-axis direction with respect to an X-Y plane in which the circuit board resides.

SUMMARY OF THE INVENTION

It is an object of the present invention to overcome the drawbacks of the prior art. More particularly, it is an object of the present invention to provide an electronic signal filter having a single circuit board including multiple filter circuits separated by isolation shields that can be automatically, and economically, assembled onto the circuit board using Z-axis robotics-type automated assembly performed in a Z-axis direction with respect to an X-Y plane in which the circuit board resides.

According to a first embodiment of the present invention, an electronic signal filter is provided including a cylindrical housing adapted to be electrically grounded, and having a first end, an opposed second end and an inner peripheral surface defining an interior compartment. The electronic signal filter also includes a single circuit board positioned within the interior compartment of the cylindrical housing, the single circuit board having a first surface, an opposed second surface, a first filter section proximate the first end of the cylindrical housing and a second filter section proximate the second end of the cylindrical housing. The circuit board is positioned such that it effectively divides the interior compartment into a first compartment defined by the first surface of the circuit board and a first portion of the inner peripheral surface of the cylindrical housing, and a second compartment defined by the second surface of the circuit board and a second portion of the inner peripheral surface of the cylindrical housing. As explained below in further detail, it is preferred that the circuit board is positioned at a location below the centerline of the filter housing.

A first shield member is also provided, extending from the first surface of the circuit board toward the first inner peripheral surface of the cylindrical housing. The electronic signal filter further includes a second shield member radially opposing the first shield member extending from the second surface of the single circuit board toward the second inner peripheral surface of the cylindrical housing, the second shield member being electrically connected the first shield member, and the second shield member being a discrete component with respect to the first shield member.

Preferably, the first shield member includes a first portion extending from the first surface of the circuit board toward the first inner peripheral surface of the cylindrical housing and an integral second portion extending into the circuit board. Further, the second shield member includes a first portion extending from the second surface of the single circuit board toward the second inner peripheral surface of the cylindrical housing, and an integral second portion extending into the circuit board.

More preferably, the second portion of the first shield member is received within a slot in the circuit board, and preferably passes through the circuit board into the second compartment of the cylindrical housing. The second portion of the first shield member also preferably includes a securing member to mechanically couple the first shield member to the circuit board proximate the second surface of the circuit board. In that manner, the first shield member can be placed on the circuit board using Z-axis robotics type manufacturing techniques, and once positioned, the securing member is engaged to mechanically couple the first shield member to the circuit board.

This mechanical connection provides stability throughout the remainder of the pre-soldering assembly process. As mentioned below in further detail, the first shield member can be thusly secured onto the circuit board either before or after the remainder of the discrete filter components are placed in appropriate positions on the circuit board, or contemporaneously therewith. However, since the minimal amount of Z-axis force needed to engage the securing member could potentially disturb other loosely fit or otherwise unaffixedly positioned filter components on the conveyor, it is preferred that the first shield member be secured onto the circuit board before the additional components are placed thereon. And although it is still preferred that the first shield member be soldered onto the circuit board, this can be accomplished by mass wave soldering after all of the discrete filter components, including the first shield member, have been assembled onto the circuit board.

It is preferred that the second portion of the first shield member includes a spacer member extending in a direction parallel to a plane of the circuit board (i.e., an X-axis direction) to maintain an axial clearance between a surface of the second portion of the first shield member and an opposed edge of the slot formed in the circuit board. This spacer member adds stability to the connection between the first shield member and the circuit board, and aids in preventing unwanted lateral movement in the X-axis direction of the plane of the circuit board. The axial clearances occupy a portion of the slot in the circuit board opposing the spacer member over a distance in the Y-axis direction. In that manner, once positioned, the second portion of the second shield member extends through the circuit board within the axial clearance. The positioning of the lower shield member in that way is explained in further detail below.

It is also preferred that one of the first and second surfaces of the circuit board includes a conductor path (e.g., conductive trace) electrically connecting the first filter section and the second filter section, and a respective one of the first shield member and the second shield member includes a section positioned adjacent the conductor path that is spaced a distance from the conductor path to prevent contact therebetween. More preferably, the distance between the conductor path and the section of a respective one of the first and the second shield members is dimensioned to provide a spark gap. That is, the dimension of the space is selected to shunt current passing through the conductive trace to the grounded shield in the event of an unacceptably high voltage surge passing through the filter.

According to another embodiment of the present invention, the first shield member comprises a first plate having a first portion extending from the first surface of the circuit board toward the first inner peripheral surface of the cylindrical housing and an integral second portion extending into the circuit board, and a second plate axially spaced from the first plate and having a first portion extending from the first surface of the circuit board toward the first inner peripheral surface of the cylindrical housing and an integral second portion extending into the circuit board. A connection member is also provided, connecting the first plate and the second plate proximate the outer periphery of the first portions thereof and contacting the first inner peripheral surface of the cylindrical housing once inserted therein. A second shield member is positioned radially opposing the first shield member and also has a first plate having a first portion extending from the second surface of the circuit board toward the second inner peripheral surface of the cylindrical housing and an integral second portion extending into the circuit board, and a second plate axially spaced from the first plate and having a first portion extending from the second surface of the circuit board toward the second inner peripheral surface of the cylindrical housing and an integral second portion extending into the circuit board. A connection member is also included in the second shield member, connecting the first plate and the second plate proximate the outer periphery of the first portions thereof and contacting the second inner peripheral surface of the cylindrical housing once inserted therein.

Preferably, the second portions of the first and the second plates of the first shield member pass through the circuit board into the second compartment of the cylindrical housing, and at least one of the second portions of the first and the second plates includes a securing member to mechanically couple the first shield member to the circuit board proximate the second surface of the circuit board. Again, the placement of the first shield member can be achieved using Z-axis automation techniques, and once engaged, the securing member holds the first shield member in place on the circuit board for the duration of the pre-soldering assembly process.

The second portions of the first and the second plates of the first shield member are preferably received within a slot in the circuit board, and at least one of the second portions preferably includes a spacer member extending in a direction parallel to a plane of the circuit board to maintain an axial clearance between a respective surface of the second portion and an edge of the slot formed in the circuit board. More preferably, the second portions of the first and the second plates of the second shield member extend through the circuit board within the axial clearance. The second portions of the first and second plates of the second shield member are thusly press-fit into the axial clearances to provide a completed shield assembly, and the stability of the connection is enhanced by a soldering step that can be performed before and after the circuit board is inserted into the filter housing.

It is preferred that one of the first and second surfaces of the circuit board includes a conductor path printed thereon, electrically connecting the first filter section and the second filter section, and at least one of the first and the second plates of a respective one of the first and the second shield members comprises a section positioned adjacent the conductor path that is spaced a distance from the conductor path to prevent contact therebetween. It is also preferred that the first portion of the shield extending from the surface of the circuit board opposite the printed surface thereof be greater than half of the total inner area of the cylindrical filter housing in order to better accommodate taller discrete filter components assembled thereon. In this case, the circuit board would be positioned in the filter housing below the centerline thereof.

Preferably, the distance between the conductor path and the section of at least one of the first and the second plates is dimensioned to provide a spark gap. That is, the dimension of the space is selected to shunt current passing through the conductive trace to the grounded shield in the event of an unacceptably high voltage surge passing through the filter. In this case, it is only necessary to provide such spark gap protection proximate the surface of the circuit board having the conductor path, and the opposing shield member can be positioned to be flush with respect to the non-printed surface of the circuit board. It is also possible, however, to include a conductive via in electrical communication with the conductor path, positioned proximate the section of the respective shield plate on the other surface of the circuit board, that passes through the circuit board to the other surface thereof. When this via is provided, it is also preferred to provide a corresponding section dimensioned on the respective shield member directly opposing the via as a secondary spark gap.

Accordingly, when each section of the first and second plates of both the first and second shield members are dimensioned to shunt current passing through the conductor path to the grounded shield in the event of a voltage surge passing through the filter, and when two vias are provided therewith, four spark gap points are offered. In addition to providing four points of protection, this precautionary measure increases the overall number of gaps and decreases the chances that all of the gaps will be rendered ineffective if and when the filter housing is filled with a stabilizing material.

According to yet another embodiment of the present invention, a method of manufacturing an electrical filter including an isolation shield assembly is provided. The method includes the steps of:

a. providing at least one circuit board having a first surface and a second surface;
b. positioning a plurality of discrete filter components on the first surface of the circuit board, forming a first filter section and a second filter section;
c. positioning a first shield member on the first and second surface of the circuit board interposed between the first and the second filter sections;
d. simultaneously soldering the discrete filter components and the first shield member in place on the circuit board;
e. positioning a second shield member on the second surface of the circuit board; and
f. positioning the circuit board with the shields and the filter components within a filter housing.

According to the method of the present invention, step b can be performed before or after step c. However, it is preferred that step b and step c are performed substantially simultaneously (i.e., within a single boarding operation). This is because, as mentioned above, the force required to engage the securing members of the first shield members can jar or otherwise disturb unsecured discrete filter components already positioned on the circuit board. But when all of the filter components, including the first shield members, are substantially simultaneously positioned on the circuit board using Z-axis manufacturing techniques, this effect is not experienced and manufacturing efficiency is increased.

According to yet another embodiment of the method of the present invention, a step of soldering the second shield member is performed between step e and step f, and another step of soldering at least one of the first and the second shield members within the filter housing is performed after step f.

All of the embodiments of the present invention beneficially enable the use of Z-axis automation techniques in the manufacture thereof, which techniques are not feasible with respect to the prior art electronic signal filters that use disc-shaped shield members, as mentioned above. Accordingly, the present invention offers an estimated savings in manufacturing costs from about 10%–15%.

BRIEF DESCRIPTION OF THE DRAWINGS

For a better understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
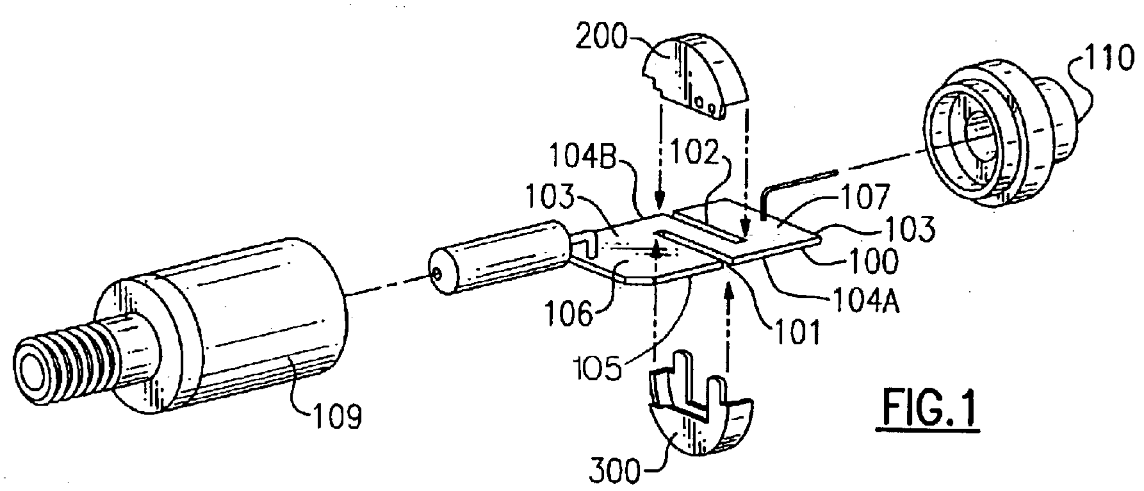
FIG. 1 is an exploded perspective view of an electronic signal filter assembly according to one embodiment of the present invention.
Figure 2A:
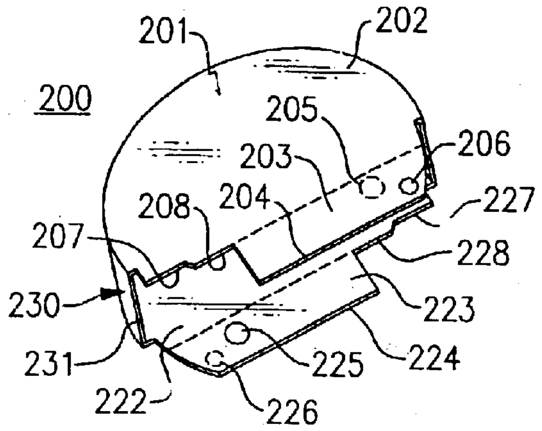
FIG. 2A is a bottom perspective view of an upper shield member according to one embodiment of the present invention.
Figure 2B:
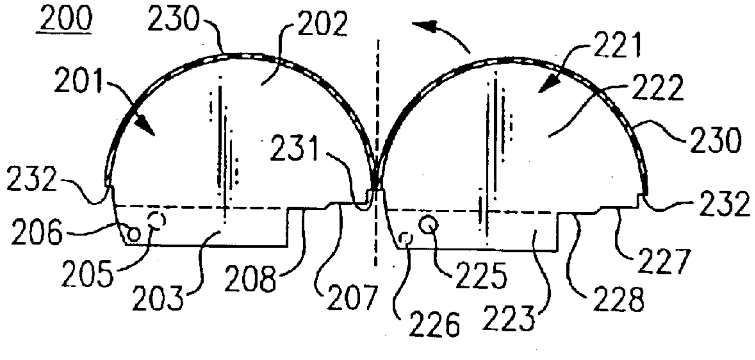
FIG. 2B is a split plan view of the upper shield member shown in FIG. 2A, opened from left to right through a centerline of connection member 230 perpendicular to the planes of the plates 201 and 221.
Figure 2C:
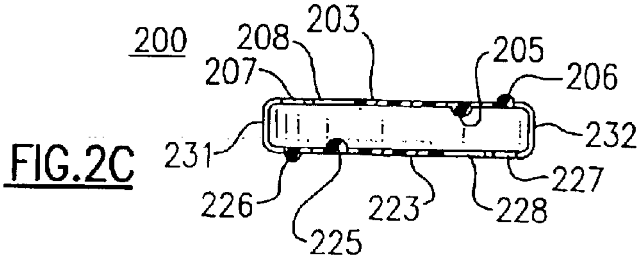
FIG. 2C is a bottom view of the upper shield member shown in FIG. 2A.

FIG. 1 is a perspective view of an electronic signal filter assembly according to one embodiment of the present invention. A circuit board 100 is divided into two filter sections 106 and 107 by slots 101 and 102, respectively. The circuit board 100 resides in a position below the centerline of the filter housing 109. A first (e.g., upper) shield member 200 for magnetically isolating the first filter section 106 and the second filter section 107 is positioned above a first surface 103 of the circuit board 100. With reference to FIGS. 2A–2C, the first shield member 200 includes a first plate 201, a second plate 221, and a connection member 230, dimensioned to span the distance between the two slots 101 and 102, which substantially perpendicularly connects the first plate 201 and the second plate 221.

Figure 3A:
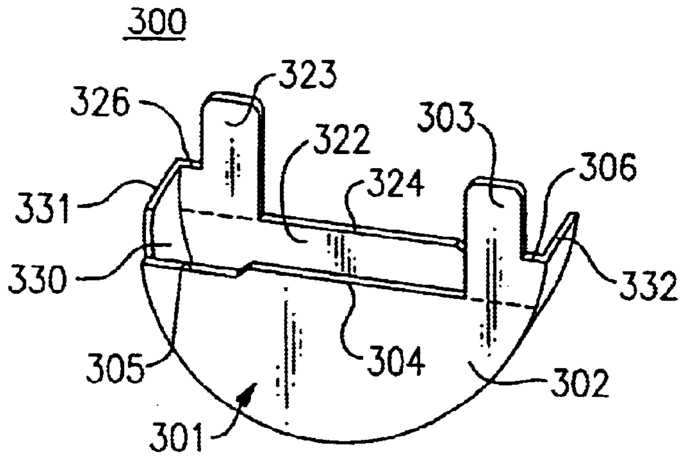
FIG. 3A is a perspective view of a lower shield member according to one embodiment of the present invention.
Figure 3B:
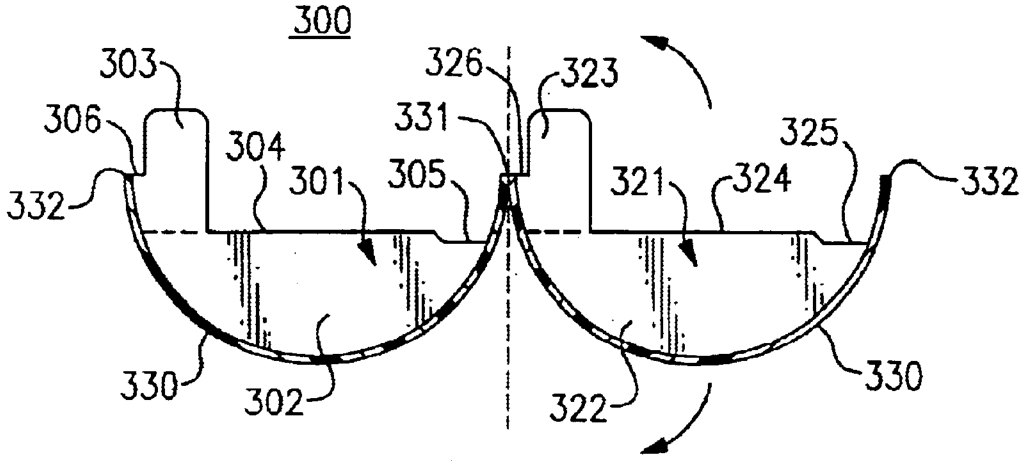
FIG. 3B is a split plan view of the lower shield member shown in FIG. 3A, opened from left to right through a centerline of connection member 330 perpendicular to the planes of the plates 301 and 321.
Figure 3C:
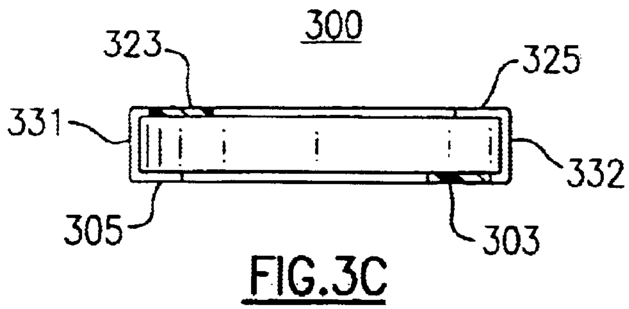
FIG. 3C is a bottom view of the lower shield member shown in FIG. 3A.

A second (e.g., lower) shield member 300 for magnetically isolating the first filter section 106 and the second filter section 107 is positioned below a second surface 105 of the circuit board 100. With reference to FIGS. 3A–3C, the second shield member 300 includes a first plate 301, a second plate 321, and a connection member 330, dimensioned to span the distance between the two slots 101 and 102, which substantially perpendicularly connects the first and second plates 301 and 321.

The first shield member 200 and the second shield member 300 are assembled onto the circuit board within slots 101 and 102 as shown in FIG. 1, and discrete filter components (not shown) are also assembled onto the circuit board 100 for each filter section 106 and 107. It is important that the circuit board 100 be properly positioned below the centerline of the filter housing 109 to best accommodate the taller filter components (not shown) which extend a distance from the first surface 103 of the circuit board 100, since that distance can be greater than half of the total inner area of the cylindrical filter housing. The circuit board assembly is then inserted into the filter housing 109, and the filter housing 109 is then sealed by end cap 110. It is also a common practice in the electronic filter industry to fill the filter housing 109 with a stabilizing material, such as polyurethane foam, after the circuit board assembly is inserted therein.

FIG. 2A is a bottom perspective view of an upper shield member 200 according to one embodiment of the present invention. A first plate 201 includes a first portion 202 having a curved peripheral edge that extends beyond the centerline such that a part of the first portion 202 is essentially greater than semi-circular. The first plate 201 also includes an integral second portion 203 extending from the first portion 202 having a side edge that follows the side peripheral curvature of the first portion 202 and having a substantially straight bottom edge 204. A dashed line has been added to FIG. 2A to show the boundary between the first portion 202 and the second portion 203.

The second portion 203 includes a spacer member 205 positioned proximate the substantially straight bottom edge 204 and spaced a predetermined distance inward from the curved peripheral side of the second portion 203. As shown, the spacer member 205 is seen as a circular or hemispherical dimple or indentation on the outer surface of the first plate 201 (and may appear to be an a circular or hemispherical protrusion on the opposing surface thereof). It should be noted that the height of the protrusion (or depth of the dimple) is more critical than the actual peripheral shape itself of the spacer member 205. The second portion 203 also includes a securing member 206 positioned proximate the substantially straight bottom edge 204 and interposed between the curved peripheral side edge of the second portion 203 and the spacer member 205. As shown, the securing member 206 is seen as a substantially round protrusion on the outer surface of the first plate 201 (and may appear to be a substantially round dimple or indentation on the opposing surface thereof).

The bottom edge of the first portion 202 includes a section having a first stepped portion 207 positioned proximate the other curved peripheral edge of the first portion 202, and an adjacent second stepped portion 208 interposed between the first stepped portion 207 and a side edge of the second portion 203. As shown in FIG. 2A, the first stepped portion 207 connects with the second stepped portion 208, and together, the substantially straight edges of the two steps connect the curved peripheral edge of the first portion 202 with the second portion 203.

Additionally, at least stepped portion 207 comprises a section of the first shield member 200 dimensioned to provide a space for a spark gap, as explained in co-pending application Ser. No. 09/654,593, filed Sep. 1, 2000, the entirety of which is incorporated by reference herein.

Specifically, the dimension of the space is selected to shunt current passing through the conductive trace to the grounded shield in the event of an unacceptably high voltage surge passing through the filter. Preferably, the shields are made of a conductive material that can be electrically grounded, such as brass for example.

A second plate 221 includes a first portion 222 having a curved peripheral edge that extends beyond the centerline such that the first portion 222 is greater than semi-circular. The second plate 221 also includes an integral second portion 223 extending from the first portion 222 having a side edge that follows the side peripheral curvature of the first portion 222 and having a substantially straight bottom edge 224. The second portion 223 includes a spacer member 225 positioned proximate the substantially straight bottom edge 224 and spaced a predetermined distance inward from the curved peripheral side edge of the second portion 223. As shown, the spacer member 225 is seen as a circular or hemispherical protrusion on the inner surface of the second plate 221, (and may appear to be a circular or hemispherical dimple or indentation on the opposing surface thereof). The second portion 223 also includes a securing member 226 positioned proximate the substantially straight bottom edge 224 and interposed between the curved peripheral side edge of the second portion 223 and the spacer member 225. As shown, the securing member 226 is seen as a substantially round dimple or indentation on the inner surface of the second plate 221 (and may appear to be a substantially round protrusion on the opposing surface thereof).

The bottom edge of the first portion 222 includes a section having a first stepped portion 227 positioned proximate the other curved peripheral edge of the first portion 222, and an adjacent second stepped portion 228 interposed between the first stepped portion 227 and the spacer member 225. As shown in FIG. 2A, the first stepped portion 227 connects with the second stepped portion 228, and together, the terminal edges of the two steps connect the curved peripheral edge of the first portion 222 and the second portion 223. Additionally, at least stepped portion 227 comprises another section of the first shield member 200 dimensioned to provide a spark gap.

A substantially curved connection member 230 is also provided, extending from a first end 231 to a second end 232 thereof along an arc corresponding to the radius of curvature of the first portions 202 and 222 of the first and second plates 201 and 221. The first and second plates 201 and 221 are located on parallel planes, and the connection member 230 is interposed therebetween and positioned perpendicular thereto. In that manner, the connection member 230 connects the two plates 201 and 221 along a substantial portion of the curved peripheral sides thereof.

FIG. 2B is a split plan view of the upper shield member shown in FIG. 2A, opened from left to right along a centerline of connection member 230 sliced parallel to the planes of the plates 201 and 221. That is, the inner surfaces of each of the plates 201 and 221 are shown in a front view, and one half of the width of the connection member 230 is seen on each plate 201 and 221 in a cross sectional view perpendicular to the plane of the paper (and the plates 201 and 221).

FIG. 2C is a bottom view of the upper shield member shown in FIG. 2A. A portion of the second portion 203 of the first plate 201 (shaded for clarity though not shown in cross-section) and a portion of the second portion 223 of the second plate 221 (shaded for clarity though not shown in cross-section) are shown in the foreground, whereas the stepped portions 207 and 208 of the first plate 201, the stepped portions 227 and 228 of the second plate 221, and the first and second ends 231 and 232 of the connection member 230 are shown distally.

The securing mechanisms 206 and 226 are shown as protrusions on the outer surfaces of the first and second plates 201 and 221, respectively. The spacer members 205 and 225 are shown as protrusions on the inner surfaces of the first and second plates 201 and 221, respectively. FIG. 2C shows that the spacer member 205 and the securing member 206 of the first plate 201 substantially oppose the stepped portions 227 and 228 of the second plate 221, and that the spacer member 225 and the securing member 226 of the second plate 221 substantially oppose the stepped portions 207 and 208 of the first plate 201.

FIG. 3A is a top perspective view of a lower shield member 300 according to one embodiment of the present invention. The lower shield member includes a first plate 301 having a first portion 302 and an integral second portion 303 extending therefrom. A dashed line has been added to FIG. 3A to show the boundary between the first portion 302 and the second portion 303. The outer periphery of the first portion 302 is curved, and the first portion 302 also includes a substantially straight bottom edge 304. It should be noted that the substantially straight bottom edge 304 does not correspond to the centerline of the lower shield member 300. That is, the curved outer periphery of the first portion 302 is less than semi-circular. The second portion 303 extends from the substantially straight bottom edge 304 of the first portion 302 proximate one curved peripheral side edge thereof, such that the second portion 330 is interposed between a small upper section 306 of the substantially straight edge 304 and the remaining lower section thereof. The substantially straight edge 304 also includes a step-like section 305 proximate the other curved peripheral side edge of the first section 302.

The lower shield member also includes a second plate 321 having a first portion 322 and an integral second portion 323 extending therefrom. A dashed line has been added to FIG. 3A to show the boundary between the first portion 322 and the second portion 323. The outer periphery of the first portion 322 is curved, and the first portion 322 also includes a substantially straight bottom edge 324. Like with the first plate 301, the substantially straight bottom edge 324 does not correspond to the centerline of the lower shield member 300, and the curved outer periphery of the first portion 322 is less than semi-circular. The second portion 323 extends from the substantially straight bottom edge 324 of the first portion 322 proximate one curved peripheral side edge thereof, such that the second portion 323 is interposed between a small upper section 326 of the substantially straight edge 324 and the remaining lower section thereof. The substantially straight bottom edge 324 also includes a step-like section 325 (see FIG. 3B) proximate the other curved peripheral side edge of the first section 322.

Further, the lower shield member includes a connection member 330 extending from a first end 331 toward a second end 332 thereof along a similar radius of curvature as that of the periphery of the first portions 302 and 322 of the two plates 301 and 321. The planes of the two plates 301 and 321 are substantially parallel, and the connection member 330 substantially perpendicularly joins the two plates 301 and 321 proximate the curved outer peripheries thereof.

FIG. 3B is a split plan view of the lower shield member shown in FIG. 3A, opened from left to right through a centerline of connection member 330 sliced parallel to the planes of the plates 301 and 321. That is, the inner surfaces of each of the plates 301 and 321 are shown in a front view, and one half of the width of the connection member 330 is seen on each plate 301 and 321 in a cross sectional view perpendicular to the plane of the paper (and the plates 301 and 321).

FIG. 3C is a top view of the lower shield member shown in FIG. 3A. A portion of the second portion 303 of the first plate 301 (shaded for clarity though not shown in cross-section), and a portion of the second portion 323 of the second plate 321 (shaded for clarity though not shown in cross-section), are shown in the foreground, whereas the stepped portion 305 of the first plate 301, the stepped portion 325 of the second plate 321, and the first and second ends 331 and 332 of the connection member 330 are shown distally. FIG. 3C also shows that the second portion 303 of the first plate 301 substantially opposes the step-like section 325 of the second plate 321, and the second portion 323 of the second plate 321 substantially opposes the step-like section 305 of the first plate 301.

Figure 4A:
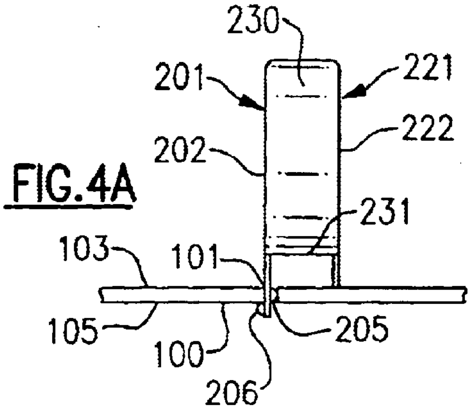
FIG. 4A is a side view of an upper shield member positioned on a circuit board according to one embodiment of the present invention.

FIG. 4A is a front view of an upper shield member 200 positioned on a circuit board 100 according to one embodiment of the present invention. FIG. 4A is best understood when read in conjunction with FIG. 4B, which is a bottom view of the circuit board 100 and upper shield member 200 assembly shown in FIG. 4A.

The circuit board 100 includes a first slot 101 opening on a first edge 104A of the circuit board 100, and a second, parallel slot 102 spaced a distance along the X-axis from the first slot 101 and opening on an opposed second edge 104B of the circuit board 100. The second portion 203 of the first plate 201 of the upper shield member 200 is positioned within slot 101, and the second portion 223 (see FIG. 4B) of the second plate 221 of the upper shield member 200 is positioned within slot 102.

The securing member 206 protruding from the outer surface of the second portion 203 of the first plate 201 catches the lip of the slot 101 on the second surface 105 of the circuit board 100 and prevents the first plate 201 from sliding upwardly out of its position within the slot. A portion of the stepped portion 208 (not shown) is positioned to be flush with the first surface 103 of the circuit board, preventing the first plate 201 from sliding further downward into the slot 101. Similarly, the securing member 226 protruding from the outer surface of the second portion 223 of the second plate 221 catches the lip of the slot 102 on the second surface 105 of the circuit board 100 and prevents the second plate 221 from sliding upwardly out of its position within the slot. A portion of the stepped portion 228 (not shown) is positioned to be flush with the first surface 103 of the circuit board, preventing the second plate 221 from sliding further downward into the slot 102.

The spacer member 205 protrudes in a direction parallel to the X-axis span of the slot 101 (and substantially perpendicular to the length of the slot) from the inner surface of the second portion 203 of the first plate 201, and contacts an opposing portion of the edge of the slot 101 to provide a clearance a along that edge of the remainder of the length of the slot 101. Similarly, the spacer member 225 protrudes in a direction parallel to the X-axis span of the slot 102 (and substantially perpendicular from the length of the slot) from the inner surface of the second portion 223 of the second plate 221 and contacts an opposing portion of the edge of the slot 102 to provide a clearance b along that edge of the remainder of the length of the slot 102. Each of the clearances a and b are dimensioned to freely accept the second portions 303 and 323 of the lower shield member 300 after the lower shield member 300 is positioned within the slots 101 and 102.

Figure 4B:
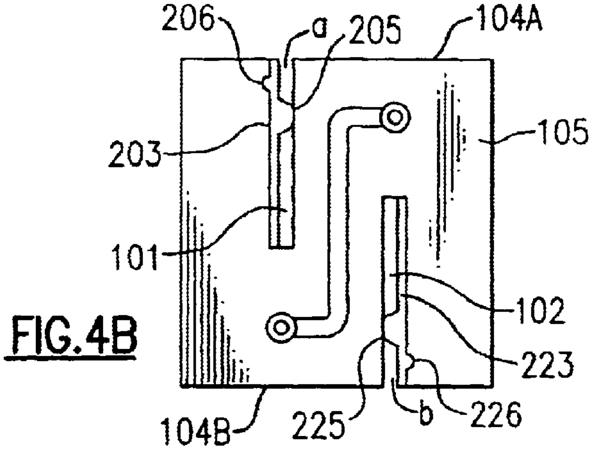
FIG. 4B is a bottom view of the circuit board and upper shield member assembly shown in FIG. 4A, wherein the spacing between the slots is exaggerated for clarity.
Figure 5A:
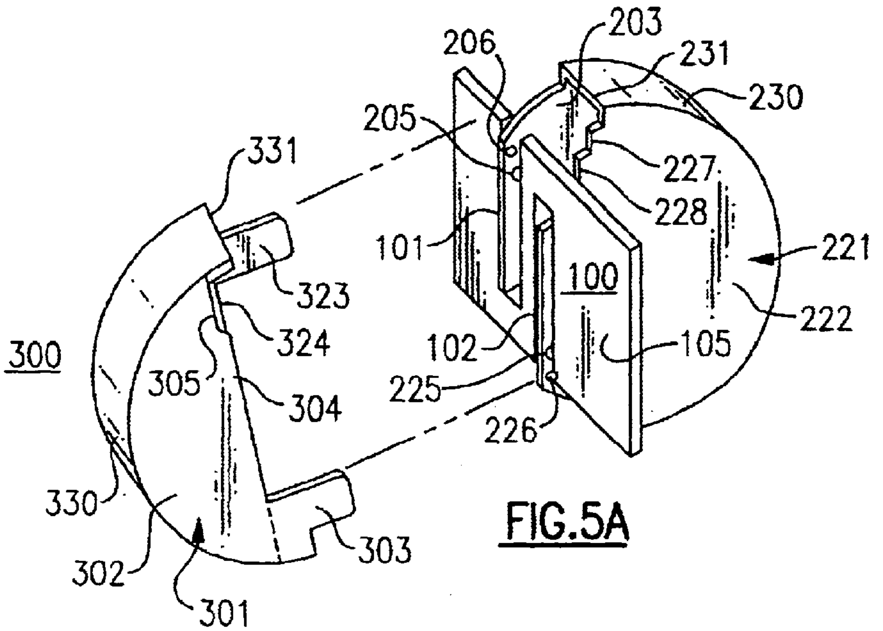
FIG. 5A is a bottom perspective view of the circuit board and upper shield member assembly shown in FIG. 4B further including a lower shield member according to one embodiment of the present invention.
Figure 5B:
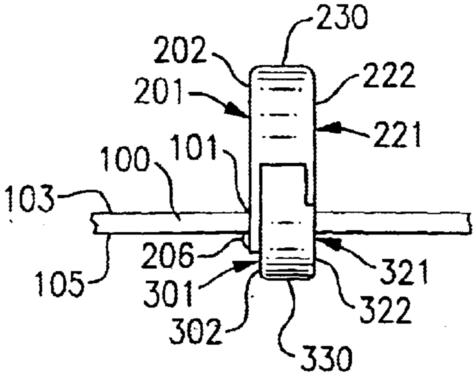
FIG. 5B is a side view of the upper and lower shield members positioned on the circuit board of FIG. 5A.

FIG. 5A is a bottom perspective view of the circuit board 100 and upper shield member 200 assembly shown in FIG. 4B, further including lower shield member 300, and FIG. 5B is a side view of upper and lower shield members 200 and 300 positioned together on the circuit board 100 of FIG. 5A. The second portion 303 of the first plate 301 of the lower shield member 300 is positioned within the clearance b (better seen in FIG. 4B) of the second slot 102, and second portion 323 of the second plate 321 of the lower shield member 300 is positioned within the clearance a (better seen in FIG. 4B) of the first slot 101.

Figure 6A:
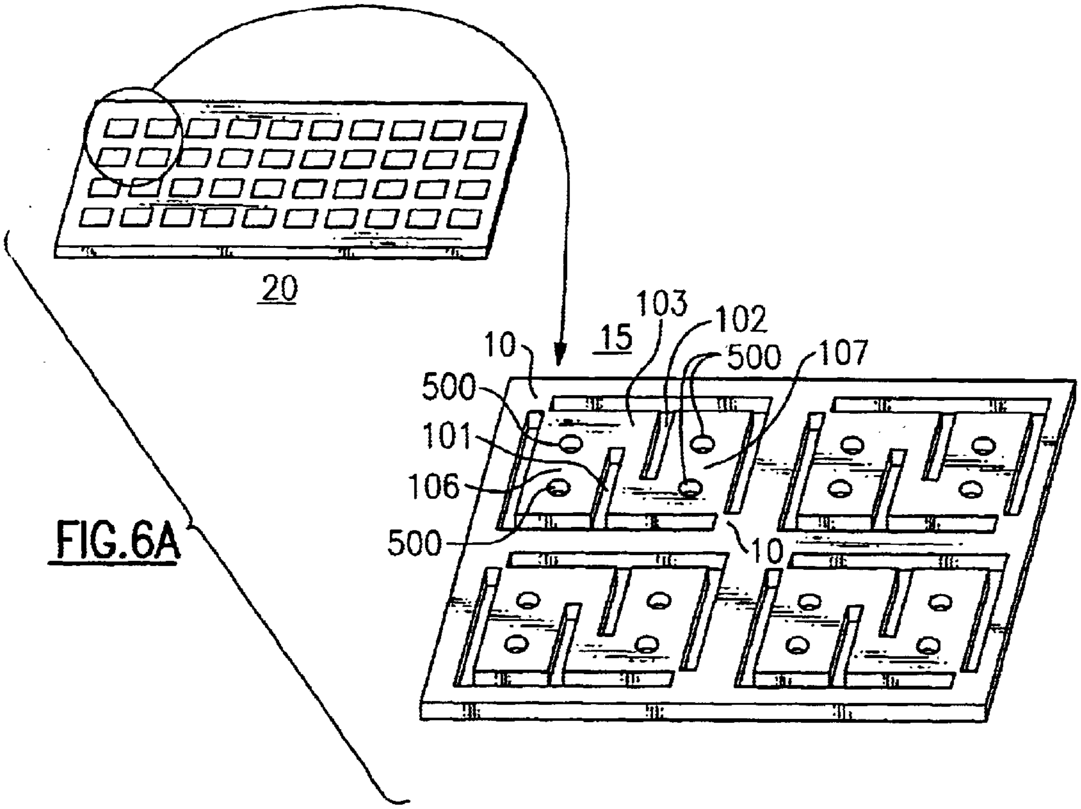
FIG. 6A is an expanded top perspective view of a portion of a circuit board array according to one embodiment of the present invention.
Figure 6B:
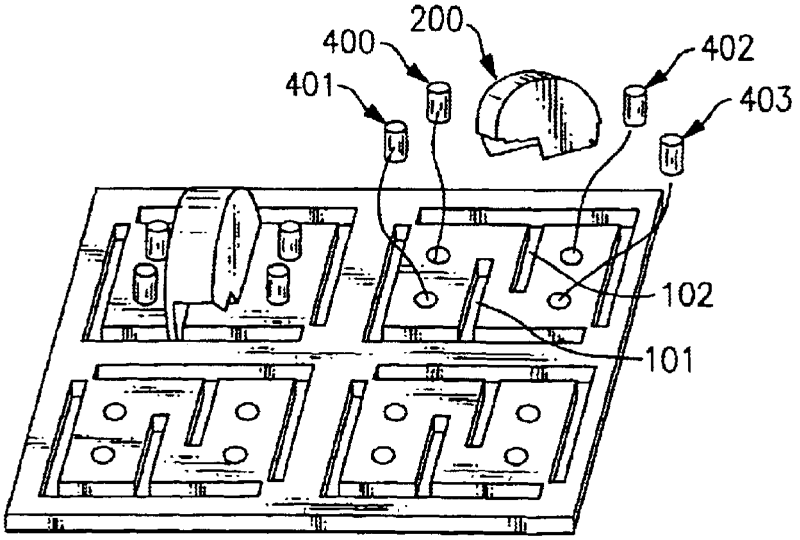
FIG. 6B is top perspective view of the expanded portion of the circuit board array shown in FIG. 6A, after discrete filter components are positioned on one circuit board of the array and showing other filter components in a pre-positioned locus above another circuit board of the array.

FIG. 6A is an expanded top perspective view of a portion of a printed circuit board array 20 according to one embodiment of the present invention, and FIG. 6B is top perspective view of the expanded portion 15 of the circuit board array shown in FIG. 6A, shown after discrete filter components 400–403 and an upper shield member 200 are positioned on one circuit board, and showing other filter components 400–403 and another upper shield member 200 (shown in an exaggerated angular manner) in a pre-positioning locus above another circuit board of the array. Each circuit board 100 is connected to the array 20 by diagonally positioned tabs 10, and each circuit board 100 includes a plurality of holes 500 to accommodate the placement of discrete filter components 400–403. Each circuit board 100 is also formed to include slots 101 and 102 for receiving the upper shield member 200 and the lower shield member 300 (not shown). The parallel and closely spaced slots 101 and 102 are preferably interposed between the two filter sections 106 and 107. It should be noted that although a pair of two-pole filter circuits are shown on each circuit board 100, the present invention is in no way limited to such a configuration.

As shown in FIG. 6B, the plurality of discrete filter components 400–403 and the upper shield members 200 can be automatically and substantially simultaneously positioned on the upper surface of the circuit board 100 while it remains a part of the array 20 using Z-axis type automated manufacturing techniques. That is, as the upper shield member 200 contacts the circuit board 100 from above in the Z-axis direction, the securing members 206 and 226 exert a force against the side edges of the slots 101 and 102, respectively as they pass through slots 101 and 102 from the first surface 103 toward the second surface 105 of the circuit board 100. The circuit board 100 is constructed of a material having sufficient resilience to allow the slots to widen proximate edges 104A and 104B to accept the passage of the protruding securing members 206 and 226, and allow the slots to resume their original shape. In that manner, securing members 206 and 226 are positioned proximate a side edge of the respective slots on the second surface 105 of the circuit board 100 when the automation step is complete. Then, the partially assembled array 20 can be mass wave soldered to secure and electrically connect the components on each circuit board of the array 20.

Figure 7:
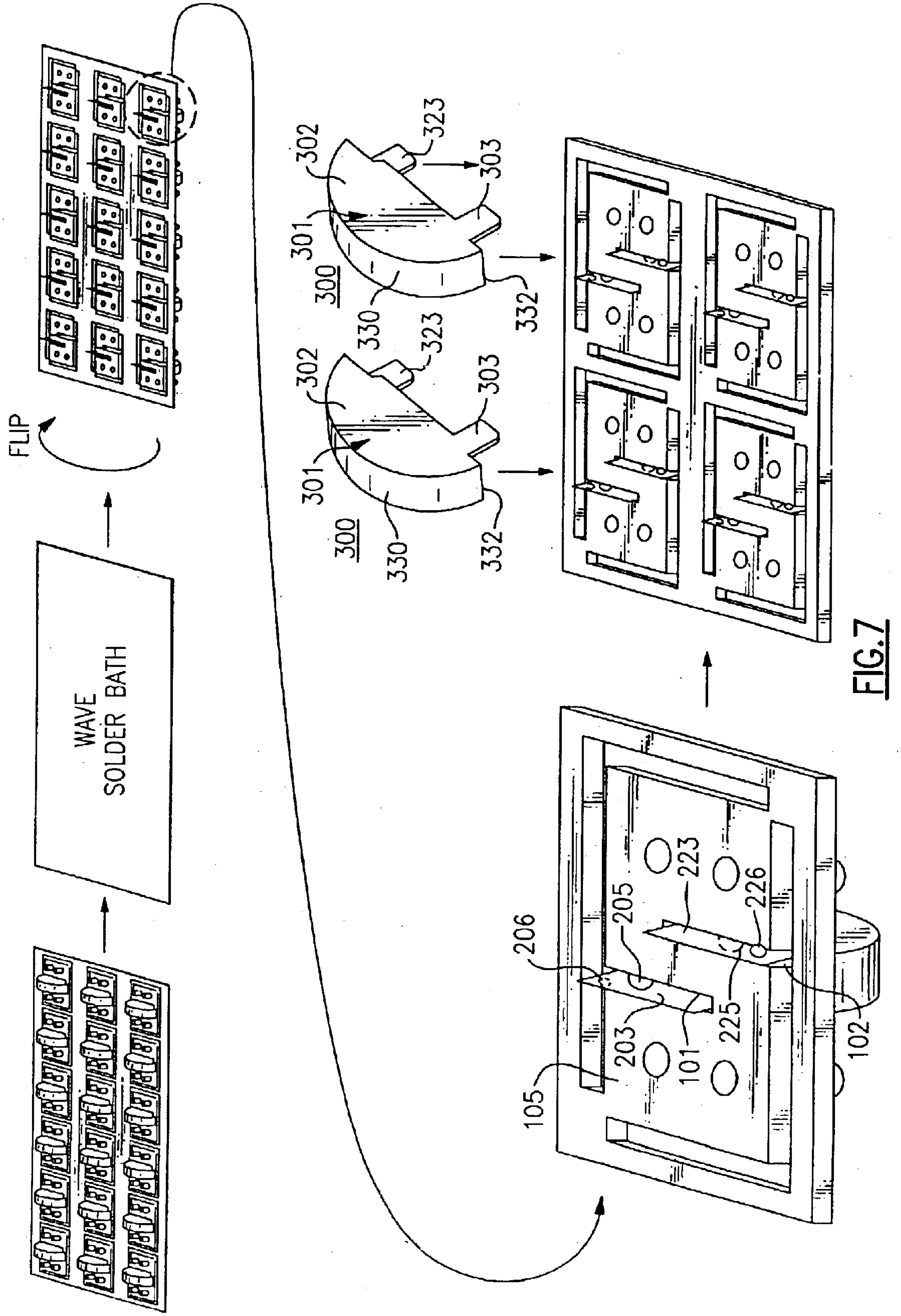
FIG. 7 is an assembly diagram illustrating the manufacturing steps according to one embodiment of the method of the present invention.
Figure 8:
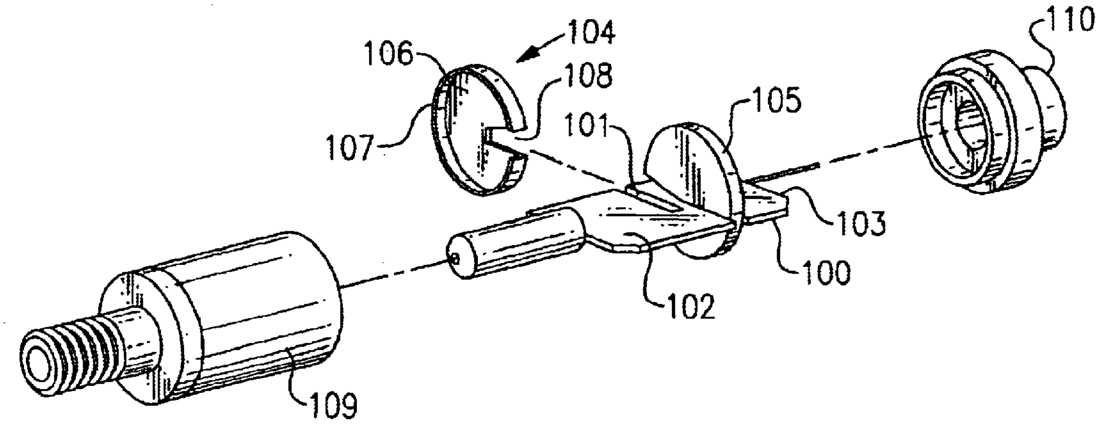
FIG.8 Prior Art
FIG. 8 is a perspective view of a prior art electronic signal filter assembly.

FIG. 7, read in conjunction with FIGS. 6A–6B, is an assembly diagram illustrating a portion of the steps for manufacturing an electronic filter according to one embodiment of the method of the present invention. As shown in FIGS. 6A–6B, a circuit board array 20 can be formed to provide individual circuit boards 100 and holes 500 for the various electrical components of the filter and slots for the isolation shields to be placed on surface 103 of the circuit board 100. The array 20 is preferably batch printed to provide the second surface 105 of each circuit board 100 with both wetting and non-wetting printed patterns (not shown). A plurality of discrete filter components 400–403 and a plurality of upper shield members 200 are positioned using known Z-axis type automated manufacturing techniques on the first surface 103 opposing the second printed surface 105 (see FIG. 6B).

As seen in FIG. 7, each of the circuit boards and the assembled components are wave soldered together as a part of the array 20. After that, the array 20 can be automatically flipped such that the second (printed) surface 105 is on top, and such that the filter components and upper shield members protrude downward from the first surface 103 of the array 20. In this position, the second portions 203 and 223 of the upper shield members 200 extend upward from the second surface. 105 of each circuit board 100 of the array 20. A plurality of lower shield members 300 (shown in an exaggerated size and angular manner) are positioned above the array and the second portions 323 and 303 are inserted into the clearances a and b of the slots 101 and 102 using Z-axis automated manufacturing techniques. The lower shield members positioned in this manner may be held in place by wave soldering the circuit board array 20 yet again. The array 20 is then flipped over, such that the first surface 103 is again on top, and the individual circuit board assemblies are singulated (i.e., separated into individual circuit board assemblies from the array) as the tabs 10 are broken.

Alternatively, the array 20 can be repositioned, such that the first surface 103 is again on top, before the lower shield members are positioned and before the tabs 10 are mechanically broken to singulate the individual circuit board assemblies 100 from the array 20. In this case, the lower shield members 300 are then positioned (with or without a soldering step) on the individual circuit boards either manually or using Z-axis automation just before the circuit board assembly is inserted into the filter housing 109 (see FIG. 1). However, it is also possible for the lower shield members 300 to be manually soldered on the circuit boards 100 immediately following the automated Z-axis placement thereon and before insertion into the filter housing 109.

Notwithstanding the order or manner in which the lower shield members are soldered in place on the circuit board, once the individual circuit boards assemblies are complete, the circuit board assemblies can be inserted into a filter housing 109 of the electronic signal filter as shown in FIG. 1. After being positioned within the filter housing 109, and after the filter cap 110 is assembled therewith, the circuit board assembly is soldered to the housing 109 and a stabilizing material (not shown) may be introduced into the spaces remaining within the filter housing 109.

It should be noted that for certain electronic signal filter devices it is not necessary to provide two shields between each adjacent pair of filter sections. For example, in a tier filter, a single slot can be provided between each section of a multiple filter sections circuit board, and a single shield can be positioned between adjacent filter sections by providing an upper shield member and a lower shield member as described below.

Figure 9A:
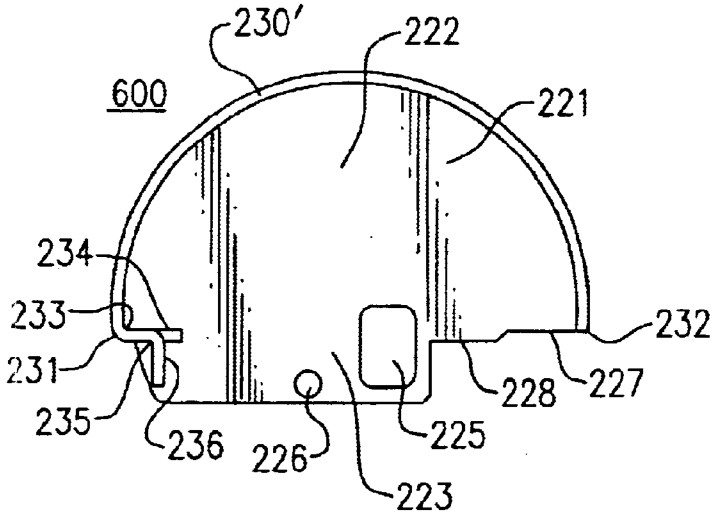
FIG. 9A is an end view of an upper shield member of a single slot shield according to an embodiment of the present invention.
Figure 9B:
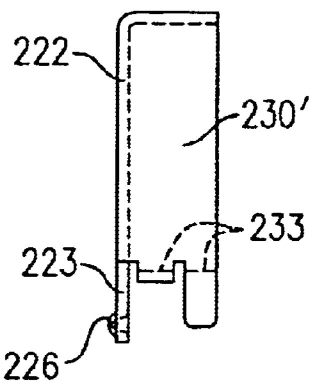
FIG. 9B is a side view of the upper shield member shown in FIG. 9A.

FIG. 9A is an end view of an upper shield member 600 of a single slot shield for an electronic signal filter, such as a tier filter, and FIG. 9B is a side view of the upper shield member shown in FIG. 9A. The upper shield member 600 of FIGS. 9A and 9B substantially corresponds to a portion of the upper shield member 200 described with reference to as shown in FIG. 2B, and includes a plate 221 which largely corresponds to the second plate 221 of the upper shield member 200. Accordingly, similar reference numerals have been assigned to similar parts and redundant descriptions have been omitted. There are, however, several structural aspects of the upper shield member 600 which differ from the upper shield member 200, as will be discussed below.

One important difference is that the securing member 226 of upper shield member 600 is more centrally positioned laterally with respect to the integral second portion 223. Another difference is that the spacer member 225 is dimensioned larger and laterally positioned proximate the second stepped portion 228. The function of these features is otherwise the same as described with reference to FIG. 2B.

Further, the plate 221 includes a lip portion 230' proximate the peripheral edge of the first portion 222 and extending from a first end 231 to a second end 232 thereof along an arc corresponding to the radius of curvature of the first portion 222. Like the connection member 230 of FIG. 2B, the lip 230' is substantially perpendicular to the plane of the plate 221. The first end 231 of the lip 230' is bent at an angle, which is substantially perpendicular to an adjacent portion of the lip 230' at elbow 233 to extend back toward the center of the plate 221 in a direction substantially parallel to the surface plane of a circuit board (not shown, e.g., inward as shown in FIG. 9A). Following the elbow 233, the bent portion of the first end 231 is divided into two separate members 234 and 236.

The first member 234 laterally extends a distance from the elbow 233 along a substantially coplanar path therefrom toward the second end 232 of lip 230' as shown. The first member 234 is adapted to be seated on a portion of the surface of the circuit board 100 spaced a distance from the single slot 101 to provide vertical positioning (i.e., height) for the upper shield member 600 (see FIG. 11B). That is, the first member 234 preserves the vertical position of the upper shield member 600 with respect to the slot 101 and helps to prevent the upper shield member 600 from further sliding downwardly into the slot 101.

The second member 236 is bent at a second elbow 235, which redirects the second member 236 in a direction substantially perpendicular to the plane of the first portion 234, and substantially perpendicular to the plane of the circuit board 100. The second member 236 is adapted to extend through a hole 110 provided in the circuit board 100 positioned a distance from the portion of the surface 103 of the circuit board 100 where the first member 234 is seated (see FIG. 11B). Positioning the second member 236 in the hole 110 of the circuit board 100 prevents unwanted lateral movement of the upper shield member 600 and further enhances the vertical stability of the upper shield member 600.

Figure 10A:
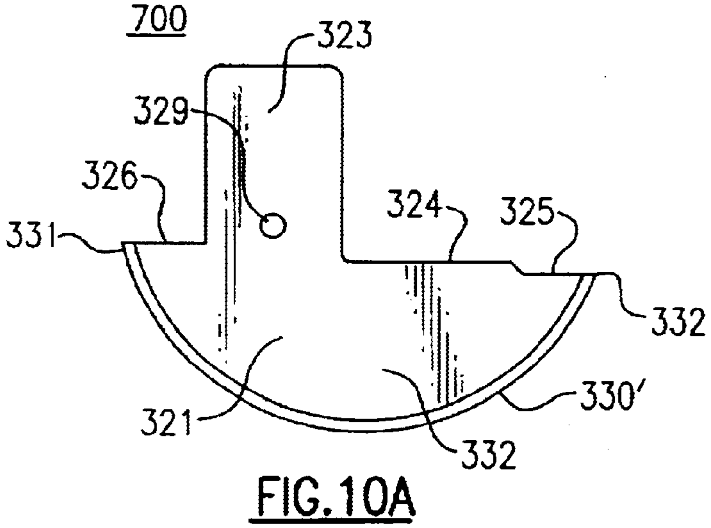
FIG. 10A is an end view of a lower shield member of a single slot shield according to an embodiment of the present invention.
Figure 10B:
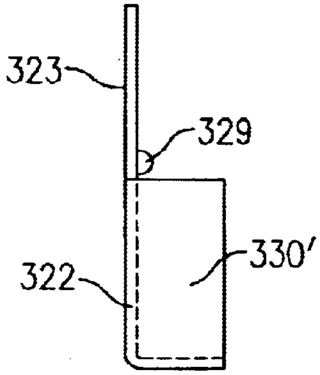
FIG. 10B is a side view of the lower shield member shown in FIG. 10A.

FIG. 10A is an end view of a lower shield member 700 to be used in conjunction with the upper shield member 600 shown in FIGS. 9A–9B, and FIG. 10B is a side view of the lower shield member 700 shown in FIG. 10A. The lower-shield member 700 of FIGS. 10A and 10B substantially corresponds to a portion of the lower shield member 300 described above with reference to FIG. 3B, and includes a plate 321 which largely corresponds to the second plate 321 of the lower shield member 300. Accordingly, similar reference numerals have been assigned to similar parts and redundant descriptions have been omitted. There are, however, several structural aspects of the lower shield member 700, which differ from the lower shield member 300, as discussed below.

One difference is that a securing member 329 is provided on a substantially central portion of the second portion 323 of the plate 321. The securing member 329 protrudes substantially perpendicularly from the plane of the second portion 323 of plate 321 such that the securing member 329 laterally extends beyond the edge of the slot 101 and contacts the first surface 103 of the circuit board 100 when the lower shield member 700 is inserted into the slot 101 (see FIGS. 11A and 11B). The securing member 329 provides a degree of vertical stability and helps prevent the lower shield member 700 from moving downwardly out of the slot 101 of the circuit board 100.

Further, the plate 321 includes a lip portion 330' proximate the curved peripheral side edge of the first portion 322 and extending from a first end 331 to a second end 332 thereof along an arc corresponding to the radius of curvature of the first portion 322. Like the connection member 330 of FIG. 3B, the lip 330' is substantially perpendicular to the plane of the plate 321. Unlike the connection member 330 of FIG. 3B, however, the second end 332 of the lip 330' does not extend past the point where the curved peripheral side edge of the first portion 322 intersects with the edge of the step-like section 325.

Figure 11B:
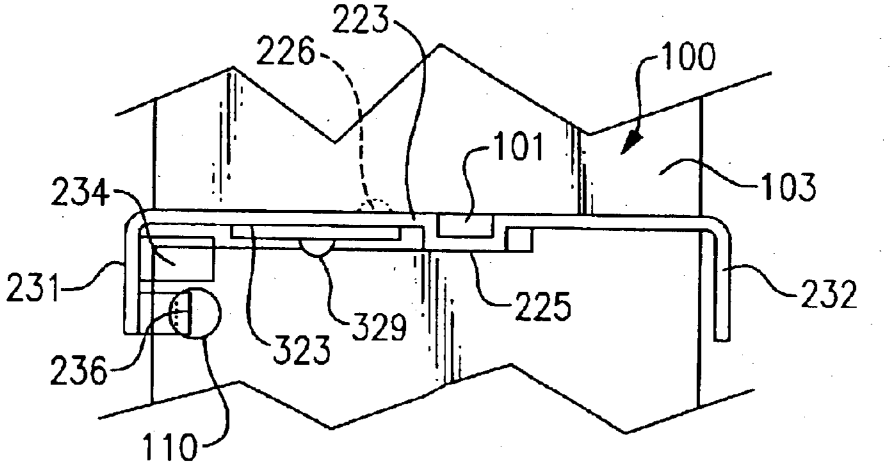
FIG. 11B is a top view of the assembled single slot shield member shown in FIG. 11A.
Figure 11A:
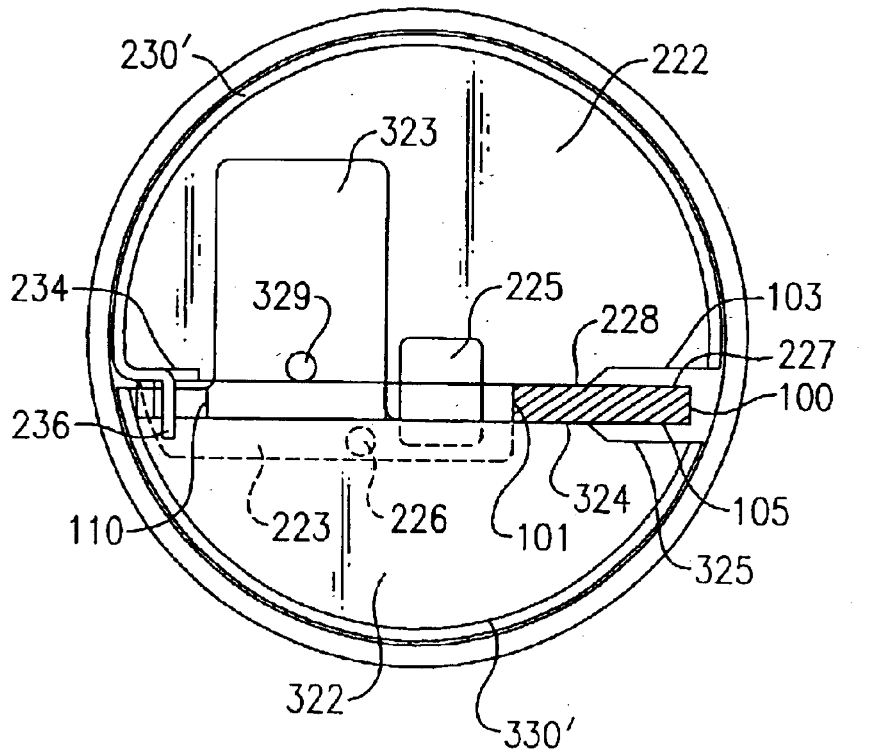
FIG. 11A is an assembled end view of a single slot shield according to an embodiment of the present invention.

FIG. 11A is an assembled end view of the upper shield member 600 and the lower shield member 700 positioned within a single slot 101 of a circuit board 100 of an electronic signal filter, such as a tier filter, and FIG. 11B is a top view of the assembled shield members 600, 700 shown in FIG. 11A.

The second portion 223 of the plate 221 of the upper shield member 600 is inserted into slot 101 of circuit board 100 (vertically downwardly, for example), such that the securing member 226 is positioned on a second surface 105 of the circuit board 100 and the spacer member 225 spans the width of the slot 101 therewithin. Further, the second member 236 of the bent first end 231 of the lip 230' is inserted into hole 110 proximate the first surface 103 of the circuit board 100, and extends through the hole 110 beyond the second surface 105 of the circuit board 100. The first member 234 of the bent first end 231 is positioned substantially flush with respect to the first surface 103 of the circuit board 100. The second stepped portion 228 also assumes a substantially flush position with respect to the first surface 103 of the circuit board 100, whereas the second stepped portion 227 is spaced a distance above the first surface 103 of the circuit board 100 sufficient to exhibit the desired spark gap characteristics discussed above.

The second portion 323 of the plate 321 of the lower shield member 700 is inserted into the slot 101 of the circuit board 100 (vertically upwardly, for example), such that the securing member 329 is positioned on the first surface 103 of the circuit board 100. The bottom edge 324 of the plate 321 assumes a substantially flush position with respect to the second surface 105 of the circuit board 100, and the step-like portion 325 is spaced a distance from the second surface 105 of the circuit board 100 sufficient to provide the spark gap characteristics as discussed above.

In this assembled position, the upper and lower shield members 600, 700 together comprise one embodiment of a single slot shield according to the present invention.

Figure 12:
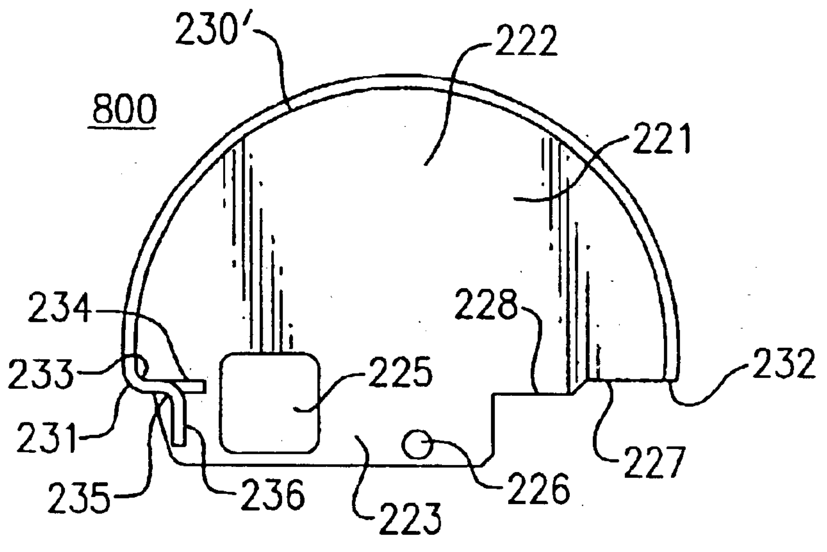
FIG. 12 is an end view of an upper shield member of a single slot shield according to another embodiment of the present invention.
Figure 13:
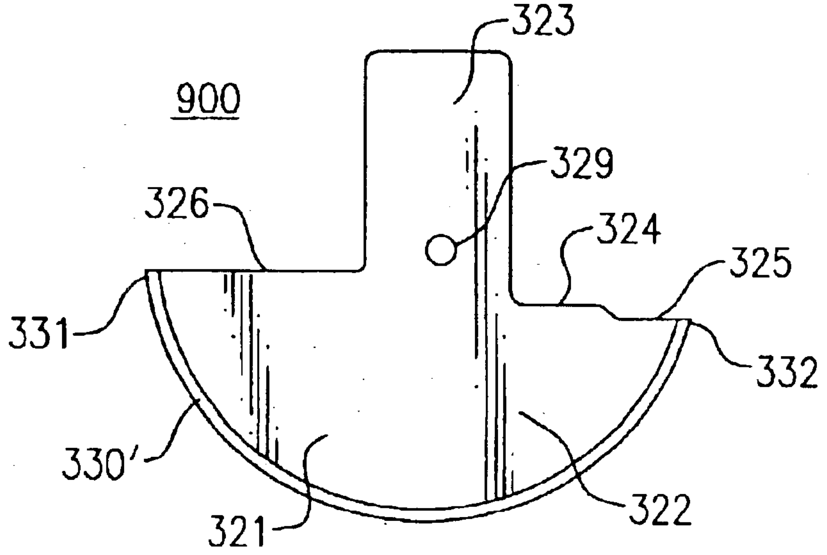
FIG. 13 is an end view of a lower shield member of a single slot shield according to another embodiment of the present invention.

FIG. 12 shows an end view of an upper shield member 800 and FIG. 13 shows an end view of a lower shield member 900 of a single slot shield for an electronic signal filter according to yet another embodiment of the present invention. The same reference numerals have been assigned to designate like components with respect to FIGS. 9A and 10A described above, and redundant descriptions have been omitted. In the embodiments shown in FIGS. 12 and 13, the structures of the upper and lower shield members 800, 900 have been modified to facilitate a better solder connection upon assembly of the electronic signal filter.

The structure of the upper shield member 800 of FIG. 12 differs from that of the upper shield member 600 of FIG. 9A in that the positions of the spacer member 225 and the securing member 226 on the integral second portion 223 have been laterally inverted with respect to one another. That is, the spacer member 225 of the upper shield member 800 is positioned proximate the first end 231 of the peripheral lip 230' and spaced a predetermined distance therefrom, and the securing member 226 is positioned proximate the first stepped portion 228, and slightly offset from a central position of the integral second portion 223. The structural modifications recognize that in some single-slot shield applications, it is necessary to solder both sides of the slot. Repositioning the locations of the spacer member 225 and the securing member 226 to better coincide with the position of copper on the circuit board as shown ensures that each side of the upper shield member 800 will be adequately soldered thereto.

In accordance with the above noted structural modifications of the upper shield member 800, structural modifications have been made to the lower shield member 900, as well. As shown in FIG. 13, the length dimension of the upper section 326 of the substantially straight edge 324 of the first portion 322 is significantly longer than the corresponding upper section 326 of the lower shield member 700 of FIG. 10A. Accordingly, the length dimension of the substantially straight edge 324 interposed between the second portion 323 and the step-like section 325 has been reduced. Further, the length dimension of the step-like section 325 has also been reduced. The securing member 329 remains in a laterally central position with respect to the second portion 323.

The upper shield member 800 and lower shield member 900 are assembled in the single slot of a circuit board in much the same manner as the single slot embodiment described above, and can be soldered on both sides.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. An electronic signal filter comprising:

a cylindrical housing adapted to be electrically grounded and having a first end, an opposed second end and an inner peripheral surface defining an interior compartment;

a single circuit board positioned within said interior compartment of said cylindrical housing, said single circuit board having a first surface, a second surface, a first filter section and a second filter section adjacent said first filter section, said circuit board substantially dividing said interior compartment into a first compartment defined by said first surface of said circuit board and a first portion of said inner peripheral surface of said cylindrical housing, and a second compartment defined by said second surface of said circuit board and a second portion of said inner peripheral surface of said cylindrical housing;

a first shield member extending from said first surface of said circuit board toward said first inner peripheral surface of said cylindrical housing; and a second shield member radially opposing said first shield member and extending from said second surface of said single circuit board toward said second inner peripheral surface of said cylindrical housing, said second shield member being electrically connected to said first shield member, and said second shield member being a discrete component from said first shield member;

wherein at least one of said first shield member and said second shield member has a portion that extends through said circuit board beyond said second surface thereof or said first surface thereof, respectively.

2. The device of claim 1, wherein said second shield member further comprises a lip positioned along a peripheral edge first portion thereof, said lip having a first end and a radially opposed second end, said lip extending from said first shield member in a direction substantially perpendicular thereto.

3. The device of claim 2, wherein said first end of said lip further comprises a first member extending generally back toward a center point of said first shield member and a second member extending in a direction substantially perpendicular to said first member.

4. The device of claim 3, wherein said first member is interposed between said first shield member and said second member.

5. The device of claim 1, wherein a longitudinal axis of said circuit board is substantially parallel to a longitudinal axis of said cylindrical housing, and said circuit board is positioned below the centerline of said interior compartment of said cylindrical housing.

6. The device of claim 1, wherein said circuit board comprises a conductor path electrically connecting said first filter section and said second filter section, formed on one of said first surface and said second surface of said circuit board, and a respective one of said first shield member and said second shield member comprises a section positioned adjacent said conductor path that is spaced a distance from said conductor path to prevent contact therebetween.

7. The device of claim 6, wherein said distance between said conductor path and said section of a respective one of said first and said second shield members is dimensioned to provide a spark gap.

8. The device of claim 1, wherein said first shield member further comprises a lip positioned along a peripheral edge portion thereof, said lip having a first end and a radially opposed second end, said lip extending from said second shield member in a direction substantially perpendicular thereto.

9. An electronic signal filter comprising:

a cylindrical housing adapted to be electrically grounded and having a first end, an opposed second end and an inner peripheral surface defining an interior compartment;

a single circuit board positioned within said interior compartment of said cylindrical housing, said single circuit board having a first surface, a second surface, a first filter section and a second filter section adjacent said first filter section, said circuit board substantially dividing said interior compartment into a first compartment defined by said first surface of said circuit board and a first portion of said inner peripheral surface of said cylindrical housing, and a second compartment defined by said second surface of said circuit board and a second portion of said inner peripheral surface of said cylindrical housing;

a first shield member extending from said first surface of said circuit board toward said first inner peripheral surface of said cylindrical housing, said first shield member comprising a first portion and an integral second portion, said first portion thereof extending from said first surface of said circuit board toward said first inner peripheral surface of said cylindrical housing, and said integral second portion extending into said circuit board; and a second shield member radially opposing said first shield member and extending from said second surface of said single circuit board toward said second inner peripheral surface of said cylindrical housing, said second shield member being electrically connected to said first shield member, and said second shield member being a discrete component from said first shield member, wherein said second shield member comprises a first portion and an integral second portion, said first portion thereof extending from said second surface of said single circuit board toward said second inner peripheral surface of said cylindrical housing, and said integral second portion extending into said circuit board.

10. The device of claim 9, wherein said second portion of said second shield member passes through said circuit board into said first compartment of said cylindrical housing, said second portion of said second shield member further comprising a securing member to mechanically couple said second shield member to said circuit board.

11. The device of claim 9, wherein said second portion of said first shield member passes through said circuit board into said second compartment of said cylindrical housing, said second portion of said first shield member further comprising a securing member to mechanically couple said first shield member to said circuit board.

12. The device of claim 11, wherein said securing member is positioned to mechanically couple said shield member to said circuit board at a position proximate said second surface of said circuit board.

13. The device of claim 11, wherein said securing member further comprises a solder joint between said first shield member and said circuit board.

14. The device of claim 9, wherein said second portion of said first shield member is received within a slot in said circuit board, and said second portion comprises a spacer member extending in a direction parallel to a plane of said circuit board to maintain an axial clearance between a surface of said second portion and an opposed edge of said slot formed in said circuit board.

15. The device of claim 14, wherein said second portion of said second shield member extends through said circuit board within said axial clearance.

16. An electronic signal filter comprising:

a cylindrical housing adapted to be electrically grounded and having a first end, an opposed second end and an inner peripheral surface defining an interior compartment;

a single circuit board positioned within said interior compartment of said cylindrical housing, said single circuit board having a first surface, a second surface, a first filter section proximate said first end of said cylindrical housing and a second filter section proximate said second end of said cylindrical housing, said circuit board substantially dividing said interior compartment into a first compartment defined by said first surface of said circuit board and a first portion of said inner peripheral surface of said cylindrical housing, and a second compartment defined by said second surface of said circuit board and a second portion of said inner peripheral surface of said cylindrical housing;

a first shield member comprising a first plate having a first portion extending from said first surface of said circuit board toward said first inner peripheral surface of said cylindrical housing and an integral second portion extending into said circuit board, a second plate axially spaced from said first plate and having a first portion extending from said first surface of said circuit board toward said first inner peripheral surface of said cylindrical housing and an integral second portion extending into said circuit board, and a connection member connecting said first plate and said second plate proximate an outer periphery of said first portions thereof and contacting said first inner peripheral surface of said cylindrical housing; and a second shield member radially opposing said first shield member and having a first plate having a first portion extending from said second surface of said circuit board toward said second inner peripheral surface of said cylindrical housing and an integral second portion extending into said circuit board, a second plate axially spaced from said first plate and having a first portion extending from said second surface of said circuit board toward said second inner peripheral surface of said cylindrical housing and an integral second portion extending into said circuit board, and a connection member connecting said first plate and said second plate proximate an outer periphery of said first portions thereof and contacting said second inner peripheral surface of said cylindrical housing.

17. The device of claim 16, wherein said circuit board comprises a conductor path electrically connecting said first filter section and said second filter section, formed on one of said first surface and said second surface of said circuit board, and at least one of said first and said second plates of a respective one of said first and said second shield members comprises a section positioned adjacent said conductor path that is spaced a distance from said conductor path to prevent contact therebetween.

18. The device of claim 17, wherein said distance between said conductor path and said section of at least one of said first and said second plates is dimensioned to provide a spark gap.

19. The device of claim 17, wherein each of said second portions of said first and said second plates of said first shield member are received within a slot in said circuit board, and at least one of said second portions comprises a spacer member extending in a direction parallel to a plane of said circuit board to maintain an axial clearance between a respective surface of said second portion and an edge of said slot formed in said circuit board.

20. The device of claim 19, wherein said second portion of said first and said second plates of said second shield member extends through said circuit board within said axial clearance.

21. The device of claim 16, wherein said circuit board comprises a conductor path, electrically connecting said first filter section and said second filter section, formed on one of said first surface and said second surface of said circuit board, and each of said first and said second plates of a respective one of said first and said second shield members comprises a section positioned adjacent said conductor path that is spaced a distance from said conductor path to prevent contact therebetween.

22. The device of claim 21, wherein said distance between said conductor path and said section of each of said first and said second plates is dimensioned to provide a spark gap.

23. The device of claim 16, wherein said circuit board comprises a conductor path electrically connecting said first filter section and said second filter section, formed on said second surface thereof, a conductive via passing through said circuit board from said first surface thereof to said second surface thereof in electrical communication with said conductor path, and each of said first and said second plates of said second shield member comprise a section positioned adjacent said conductor path that is spaced a distance from said conductor path to prevent contact therebetween, and each of said first and said second plates of said first shield member comprise a section positioned adjacent said via that is spaced a distance from said via to prevent contact therebetween.

24. The device of claim 23, wherein said distance between said conductor path and said section of each of said first and said second plates is dimensioned to provide a spark gap.

25. The device of claim 16, wherein said circuit board comprises a conductor path electrically connecting said first filter section and said second filter section, formed on said first surface thereof, a conductive via passing through said circuit board from said second surface thereof to said first surface thereof in electrical communication with said conductor path, and each of said first and said second plates of said first shield member comprise a section positioned adjacent said conductor path that is spaced a distance from said conductor path to prevent contact therebetween, and each of said first and said second plates of said second shield member comprise a section positioned adjacent said via that is spaced a distance from said via to prevent contact therebetween.

26. The device of claim 25, wherein said distance between said conductor path and said section of each of said first and said second plates is dimensioned to provide a spark gap.

27. The device of claim 16, wherein a longitudinal axis of said circuit board is substantially parallel to a longitudinal axis of said cylindrical housing, and said circuit board is positioned below the centerline of said interior compartment of said cylindrical housing.

28. The device of claim 16, wherein said second portions of said first and said second plates of said first shield member pass through said circuit board into said second compartment of said cylindrical housing, and at least one of said second portions of said first and said second plates further comprises a securing member to mechanically couple said first shield member to said circuit board.

29. The device of claim 28, wherein said securing member is positioned to mechanically couple at least one of said second portions of said first and said second plates of said first shield member to said circuit board at a position proximate said second surface of said circuit board.

30. The device of claim 28, wherein said securing member further comprises a solder joint between said first shield member and said circuit board.

31. The device of claim 16, wherein said second portions of said first and said second plates of said first shield member pass through said circuit board into said second compartment of said cylindrical housing, and each of said second portions of said first and said second plates further comprises a securing member to mechanically couple said first shield member to said circuit board.

32. The device of claim 31, wherein said securing member is positioned to mechanically couple each of said second portions of said first and said second plates of said first shield member at positions proximate said second surface of said circuit board.

33. A method of manufacturing an electrical filter including an isolation shield assembly comprising the steps of:

a. providing at least one circuit board having a first surface and a second surface;

b. positioning a plurality of discrete filter components on one of said first and said second surfaces of said circuit board forming a first filter section and a second filter section;

c. positioning a first shield member on a respective one of said first and said second surfaces of said circuit board interposed between said first and said second filter sections;

d. simultaneously soldering said discrete filter components and said first shield member in place on said circuit board;

e. positioning a second shield member on the other surface of said circuit board; and f. positioning said circuit board with said shields and said filter components within a filter housing.

34. The method of claim 33, further comprising the step of soldering at least one of said first and said second shield members within said filter housing after step f.

35. The method of claim 33, wherein step b is performed before step c.

36. The method of claim 33, wherein step c is performed before step b.

37. The method of claim 33, wherein step b and step c are performed substantially simultaneously.

38. The method of claim 33, further comprising a step of soldering said second shield member between step e and step f.

* * * * *

UNITED STATES PATENT AND TRADEMARK OFFICE

CERTIFICATE OF CORRECTION

PATENT NO. : 6,759,927 B2
DATED : July 6, 2004
INVENTOR(S) : Joseph N. Maguire et al.

It is certified that error appears in the above-identified patent and that said Letters Patent is hereby corrected as shown below:

Column 18,
Line 32, add -- first -- after "said"

Signed and Sealed this

Twenty-third Day of November, 2004

JON W. DUDAS
*Director of the United States Patent and Trademark Office*